(12) United States Patent
Linder et al.

(10) Patent No.: US 7,375,324 B2
(45) Date of Patent: May 20, 2008

(54) STYLUS SYSTEM FOR MODIFYING SMALL STRUCTURES

(75) Inventors: Robert Linder, Tigard, OR (US); Eric Kneedler, Portland, OR (US)

(73) Assignee: Fei Company, Hillsboro, OR (US)

( * ) Notice: Subject to any disclaimer, the term of this patent is extended or adjusted under 35 U.S.C. 154(b) by 371 days.

(21) Appl. No.: 11/104,876

(22) Filed: Apr. 13, 2005

(65) Prior Publication Data

US 2005/0266586 A1 Dec. 1, 2005

Related U.S. Application Data

(60) Provisional application No. 60/562,402, filed on Apr. 15, 2004.

(51) Int. Cl.
*G01N 23/00* (2006.01)

(52) U.S. Cl. .................. 250/307; 250/306; 73/105; 977/856

(58) Field of Classification Search ............ 438/4; 250/307; 977/856; 73/105
See application file for complete search history.

(56) References Cited

U.S. PATENT DOCUMENTS

| | | | |
|---|---|---|---|
| 5,307,693 A | | 5/1994 | Griffith et al. |
| 5,756,887 A | | 5/1998 | Bryson, III et al. |
| 5,831,181 A | * | 11/1998 | Majumdar et al. ............ 73/863 |
| 6,006,594 A | * | 12/1999 | Karrai et al. ................. 73/105 |
| 6,178,653 B1 | | 1/2001 | Griffith |
| 6,197,455 B1 | | 3/2001 | Yedur et al. |
| 6,250,143 B1 | * | 6/2001 | Bindell et al. ................ 73/105 |
| 6,353,219 B1 | | 3/2002 | Kley |
| 6,884,999 B1 | * | 4/2005 | Yedur et al. ................. 250/306 |
| 2002/0042081 A1 | * | 4/2002 | Henderson et al. .......... 435/7.1 |

FOREIGN PATENT DOCUMENTS

| | | |
|---|---|---|
| JP | 04289861 | 10/1992 |
| JP | 04289861 A | 10/1992 |
| WO | WO02/45215 A2 | 6/2002 |
| WO | WO 0245215 A | 6/2002 |

OTHER PUBLICATIONS

Joseph E. Griffith and David A. Grigg, "Dimensional Metrology with Scanning Probe Microscopes," J. Appl. Phys. 74 (9) Nov. 1, 1993. R83-R109.

* cited by examiner

*Primary Examiner*—Jack I. Berman
*Assistant Examiner*—Andrew Smyth
(74) *Attorney, Agent, or Firm*—Scheinberg & Griner, LLP; David Griner; Michael O. Scheinberg

(57) ABSTRACT

An improved method for rapidly and accurately modifying small structures, including structures on a micron or nanometer scale, suitable for the repair of defects in lithographic photo-masks and semiconductors on a nano-scopic level. Features or samples repaired may be conductive or non-conductive. A single instrument can be employed to both observe the surface of the mask or wafer, and to effectuate the repair of conductive and non-conductive features thereon. Using a Stylus-Nano-Profilometer probe, rapid lateral strokes across the sample surface in a definable pattern at known high applied pressure are used to effectuate defect repair. The tip of the probe can also be dithered rapidly in a pattern or used as to create a jackhammer effect to more effectively remove material from the sample surface.

27 Claims, 4 Drawing Sheets

STYLUS SYSTEM FOR MODIFYING SMALL STRUCTURES

This application claims priority from U.S. Prov. Pat. App. 60/562,402, filed Apr. 15, 2004, which is hereby incorporated by reference.

TECHNICAL FIELD OF THE INVENTION

The present invention relates to the field of repair of mask defects in lithography and repair of defects in semi-conductors.

BACKGROUND OF THE INVENTION

Manufacture of semiconductors with high device densities requires the high-resolution lithography of small, closely-spaced features on semiconductor wafers. Such features are typically formed first by a photolithography process in temporary layers of photoresist, and the photoresist features are then used to create permanent structures on the wafer. For example, holes are formed in insulating layers and later filled with a conductive material to create connections between layers in a circuit. Trenches are also formed in insulating layers and later filled with a conductive material to form capacitors. Groups of thin conductive lines are formed to make buses to carry signals from one area of a chip to another. The groups of conductors are characterized by the width of each conductor and a pitch, that is, the distance between the conductors.

As device density increases, the difficulty of producing photo-masks for the lithographic process without defects also increases. Defects on photo-mask layers commonly arise from small particles of foreign material, bubbles in the photo-resist, or other flaws introduced during the pattern generation process. To replace a defective mask is impractical since a subsequently developed mask is as likely to be defective as the mask to be replaced. Thus, repair of a defective mask is more desirable. To this end, there is a need to constantly monitor the fabrication process to identify and repair defects. In some cases, every wafer going through the fabrication line is measured in what is sometimes referred to as in-line metrology.

Engineers may monitor both the features on the temporary photoresist layer and the permanent features created on the wafer. These features are three-dimensional structures and a complete characterization must describe not just a surface dimension, such as the top width of a hole or conductor, but a complete three-dimensional profile of the feature. For example, although an ideal feature typically has vertical sidewalls, the actual sidewalls may have excessive slope that narrows or widens the feature below its top surface. Process engineers must be able to accurately observe defects in order to repair them.

Methods of observation are known in the art. For example, scanning probe microscopy, allows 3-D imaging of surfaces with sub-nanometer resolution. A scanning probe microscope (SPM) uses a very small probe tip that is scanned at a slow rate across the surface of a substrate. There are many types of SPMs, including several types of atomic force microscopes (AFM). An SPM can operate in two different modes—contact mode or non-contact mode. In contact mode, the probe tip comes into physical contact with the sample surface. In non-contact mode, the probe tip does not actually touch the sample surface. Instead, the probe tip is in close proximity to the sample surface and interactive forces between the probe tip and the surface are measured.

In one type of AFM used in semiconductor processing, the probe tip is attached to a cantilever that is in turn attached to a piezoelectric actuator. The vibration amplitude of the cantilever driven near resonance frequency is monitored by reflecting a laser beam off the back surface of the cantilever into a photodiode sensor. Changes in the vibration amplitude of the cantilever cause changes in the readout signal of the optical sensor at the same frequency. The amplitude is sensitive to changes in tip-sample interaction, usually a result of distance change between tip and sample. The actuator maintains a level of tip-sample interaction. The probe tip moves up and down in response to peaks and valleys on the sample surface. The vertical positions at or near contact are tabulated and provide a profile of the surface.

A piezoelectric scanner (capable of extremely fine movements) typically is used as a positioning stage to accurately position the probe tip over the sample. The scanner moves the probe tip across the first line of the scan, and back. It then steps in the perpendicular direction to the second scan line, moves across it and back, then to the third line, and so forth. The path differs from a traditional raster pattern in that the alternating lines of data are not taken in opposite directions. AFM data are usually collected in only one direction to minimize line-to-line registration errors that result from scanner hysteresis.

As the scanner moves the probe tip along a scan line, the AFM collects data concerning the surface of the sample at equally spaced intervals. The spacing between the data points is called the step size or pixel size. The accuracy of the scan can be increased by using a smaller pixel size (which results in a greater number of data points, also referred to as pixel density). However, scans using a greater pixel density take longer to complete and require more resources to store and process.

Cantilever-based AFM instruments suffer from a number of shortcomings that limit their usefulness for mass-production CD metrology applications. Contact-mode AFMs, especially those where the probe tip remains in constant contact with the sample surface, are prone to tip wear and the gradual buildup of contamination from the sample onto the probe tip. Non-contact AFMs do not have a problem with tip wear, however, they are much more vulnerable to error caused by localized charges, humidity, or even particulate contamination. Both types of cantilever-based AFMs also have the potential for tip or sample damage because the tip has to stay so close to the sample surface. Even more significant, both types of cantilever-based AFMs suffer from low throughput. When operated at a sufficient resolution to accurately measure current critical dimensions, it can take several minutes to make measurements across one feature and several hours to measure a 50 µm square area. For these reasons, prior art AFMs in a production operation can profile only a limited area on a semiconductor chip.

One commonly used type of stylus device is a profilometer device such as the Stylus Nano-Profilometer (SNP), commercially available from FEI Company, Hillsboro, Oreg., the assignee of the present application. In contrast to the cantilever system employed by the typical AFM, the SNP makes use of a probe tip attached to a rocking balance beam, similar to those disclosed in U.S. Pat. No. 5,307,693, to Griffith et al. for "Force-Sensing System, Including a Magnetically Mounted Rocking Element" and in U.S. Pat. No. 5,756,887 to Bryson et al. for "Mechanism for Changing a Probe Balance Beam in a Scanning Probe Microscope." Unlike other devices that sense while scanning the probe over the surface, the SNP measures the geometry of a surface by descending to the surface and contacting it at different points. Thus, unlike scanning devices, the SNP is designed to rapidly move downward toward a surface, contact the surface, and then move rapidly to a new position. Recently developed probe tips have a cylindrically or approximately square shaped cross section of dimensions of 0.2 µm or less. Such a small probe tip is usually relatively short, on the order of a micrometer, and is supported on a proximal end by a more massive tip support.

A typical probe is schematically illustrated in FIG. 1. During operation of the SNP, the probe 20 is discontinuously scanned horizontally along a line. At multiple positions, which are typically periodically spaced, the horizontal scan of the probe 20 is stopped, and it is lowered until it is stopped by the substrate surface 12. Circuitry to be briefly described later measures the height at which the probe tip stops. The SNP probe 20 is then retracted from the surface 12 a distance sufficient to clear any vertical features, moved horizontally a preset distance, and then moved vertically back toward the surface 12. A series of such measurements around the feature being probed, for example, on either sidewall 14 of and within the trench 10, provides a profile or topography of the sample.

An SNP is schematically illustrated in the side view of FIG. 2. A sample 30 to be examined is supported on a support surface 32 supported successively on a tilt stage 34, an x-slide 36, and a y-slide 38, all of which are movable along their respective axes so as to provide horizontal two-dimensional and tilt control of the sample 30. The tilt stage is also capable of 10 mm or more of vertical Z travel. Although these mechanical stages provide a relatively great range of motion, their resolutions are relatively coarse compared to the resolution sought in the probing. The bottom y-slide 38 rests on a heavy granite slab 40 providing vibrational stability. A gantry 42 is supported on the granite slab 40. A probe head 44 hangs in the vertical z-direction from the gantry 42 through an intermediate piezoelectric actuator 45 that provides about 30 µm of motion in x and y and 15 µm in z by way of a piezo driven 3-axis flexure system 46 controlled by linearized capacitors in closed loop. Probe head 44 includes a small attached probe 20 that projects downwardly from the probe head 44 so that probe 20 can selectively engage with the top surface of the sample 30 and thereby determine its vertical and horizontal dimensions.

Principal parts of the probe head 44 of FIG. 2 are illustrated in the side views of FIGS. 3 and 4. A dielectric support 50 fixed to the bottom of the piezoelectric actuator 45 includes on its top side, with respect to the view of FIG. 2, a magnet 52. On the bottom of the dielectric support 50 are deposited two isolated capacitor plates 54, 56 and two interconnected contact pads 58. A conductive beam 60 is medially fixed on its two lateral sides and electrically connected to two metallic and ferromagnetic ball bearings 62, 64. Ball bearings 62, 64 are placed on the contact pads 58 and generally between the capacitor plates 54, 56, and held in place by magnet 52.

Beam 60 is held in a position generally parallel to the dielectric support 50 with a balanced vertical gap 66 of about 25 µm between the capacitor plates 54, 56 and the beam 60. Two capacitors are formed between the respective capacitor pads 54, 56 and the conductive beam 60. Capacitor pads 54, 56 and contact pads 58, all electrically connected to the conductive beam 60, are also connected to three terminals of external measurement and control circuitry to be described later. Beam 60 holds on its distal end a glass tab 70 to which is fixed a stylus 72 having a probe 20 projecting downwardly to selectively engage the top of the sample 30 being probed. An unillustrated dummy stylus or substitute weight on the other end of the beam 60 can provide rough mechanical balancing of the beam in the neutral position.

The typical SNP operates through the use of a force-balance system, so that externally applied force (such as the force generated when the probe tip encounters a feature) acts on a sensing device, the output of which produces a locally generated counteracting force to drive the sensor output back to zero. Capacitor plates 54, 56 and the two contact pads 58 are separately connected by three unillustrated electrical lines to three terminals of external measurement and control circuitry. This servo system both measures the two capacitances and applies differential voltage to the two capacitor plates 54, 56 to keep them in the balanced position. When the piezoelectric actuator 45 lowers the stylus 72 to the point that probe 20 encounters the surface of the feature being probed, the beam 60 rocks upon the contact of probe 20 with the sample 30. The difference in capacitance between the plates 54, 56 is detected, and the servo circuit attempts to rebalance the beam 60 by applying different voltages across the two capacitors.

Two different feedback loops are thus at work during the operation of the SNP. When the probe head 44 is lowered until the probe 20 touches the sample surface 30, the balance beam 60 will typically be knocked a little off balance. The dual feedback system works to adjust the vertical position of the probe 20 by way of the piezoelectric actuator 45 and to bring the beam 60 back into balance by applying different voltages across the two capacitors. Whenever the force acting on the probe 20 (measured by the voltage applied in order to balance the beam) is below a certain force set point, the piezoelectric actuator 45 will lower the probe head. If the force acting on the probe 20 is above the force set point, the piezoelectric actuator 45 will raise the probe head 44. When the two feedback loops reach equilibrium, the force acting on the probe 20 will be at the force set point and the beam 60 will be returned to a balanced state. When this occurs, the vertical position of the piezoelectric actuator 45 can be used as an indication of the depth or height of the feature at the particular data point being measured.

In some applications, the SNP uses optical pattern recognition to locate the features of interest to within approximately 1 micron. Therefore, it is necessary to establish the offset between the optical system and the tip. This is done by scanning a pattern called a "tipfinder" after locating a reference point on the tipfinder with the optical system. The tipfinder is described in U.S. Pat. No. 6,178,653. A scan line anywhere on the area of the pattern is coded in bits vertically to the X, Y coordinate of the pattern, thus establishing where the tip is relative to the optical system.

Methods of repair are also known in the art including focused ion beam milling and laser ablation. However, repair of small defects using these methods is very difficult. Alternatively, repair of small defects can be made using a scanning tunneling microscope probe to observe features and to scrape off excess material from the mask or wafer and to deposit material where material is deficient. This method is described in U.S. Pat. No. 6,197,455. However, this method requires interaction between the probe and a conducting surface for observation of the features to be repaired.

Repair using scanning probe microscopy is generally discussed in U.S. Pat. No. 6,353,219, wherein it is suggested that a cantilever-mounted probe can be pressed against the surface and dragged across the surface to cut into it. Cantilever systems, which are designed to scans above a surface, must approach the surface slowly to prevent probe tip damage. This slows processing when the probe must be moved between calibration structures and the work piece or when switching between measuring and processing. Also, in the system therein described, the force and more importantly the pressure applied by the probe to the surface may vary as the probe is scanned over different topography. Since wear is related non-linearly to force, wear is unpredictable over time.

What is needed is a method of repair of defects in features of a mask or wafer that may be conductive or non-conductive. What is also needed is to combine such a method with a method of observation implemented by a single instrument. Further, what is needed is a method for performing repair of defects using multiple rapid strokes in a definable pattern at known high applied pressure.

SUMMARY OF THE INVENTION

The present invention provides a method for rapidly and accurately modifying small structures, including structures on a micron or nanometer scale, and is suitable for the repair of defects in lithographic photo-masks and semiconductors on a nano-scopic level. According to the present invention, a method is provided for repair of defects in features that may be conductive or non-conductive. Also, a single instrument may be employed to both observe the surface of the mask or wafer, and to effectuate the repair of conductive and non-conductive features thereon.

In one preferred embodiment, the present invention provides a method for performing rapid lateral strokes in a definable pattern at known high applied pressure to effectuate defect repair. According to one embodiment of the invention, a profilometer device such as a Stylus-Nano-Profilometer (SNP) is employed to locate and characterize a defect at low force. A grinding area is established that includes the defect. The probe is moved from point to point over the grind area. As the probe moves, it is in continuous force-controlled contact with the surface. In some embodiments, the tip of the probe is then dithered rapidly in a pattern.

According to another embodiment aspect of the invention, a repair boundary or "manifold" is specified. The tip of the SNP probe is constrained from passing through the manifold. Where the manifold is reached, the probe tip is under position feedback to effectively cease grinding. In this way the geometry of the repair is self-limiting and ensures that the repair is completed within specifiable tolerances. The manifold can simply be a specified distance from the surface. The manifold may exhibit a vertical component for repair of defects on vertical structures. According to another aspect of the invention, reference points or structures may be observed at occasional or regular intervals to ensure correct positioning of the probe tip during the repair process and to evaluate tip wear. According to yet another aspect of the invention, the probe tip is shaped to concentrate force and facilitate debris removal.

The foregoing has rather broadly outlined features and technical advantages of the present invention in order that the detailed description of the invention that follows may be better understood. Additional features and advantages of the invention will be described hereinafter. It should be appreciated by those skilled in the art that the conception and specific embodiment disclosed herein may be readily utilized as a basis for modifying or designing other structures for carrying out many useful purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
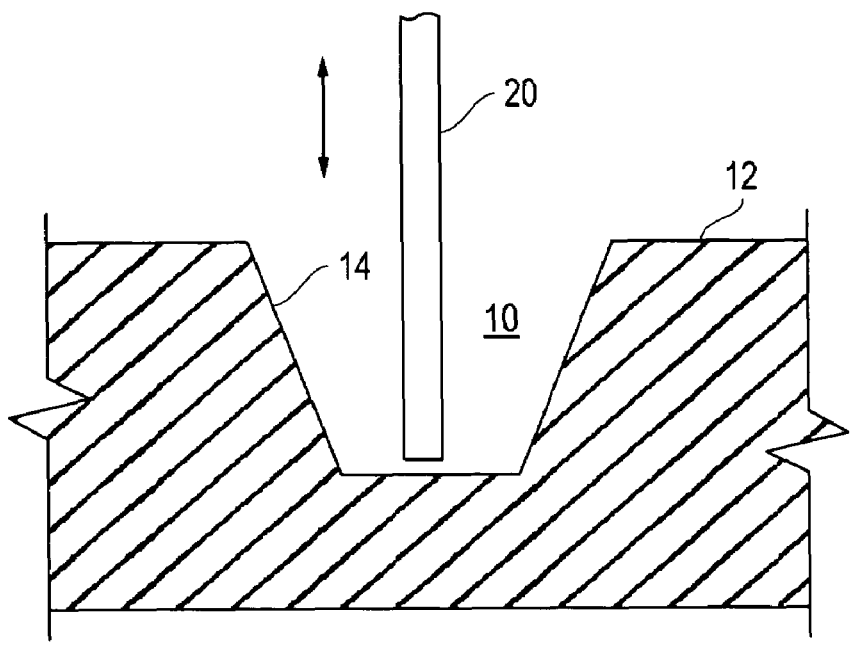
FIG. 1 shows a probe of a Stylus Nano-Profilometer (SNP)
Figure 2:
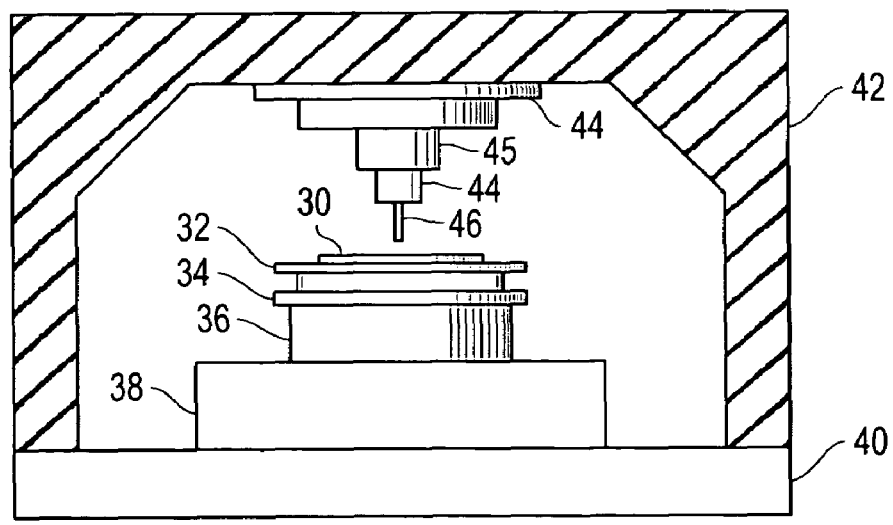
FIG. 2 shows a schematic view of an SNP.
Figure 3:
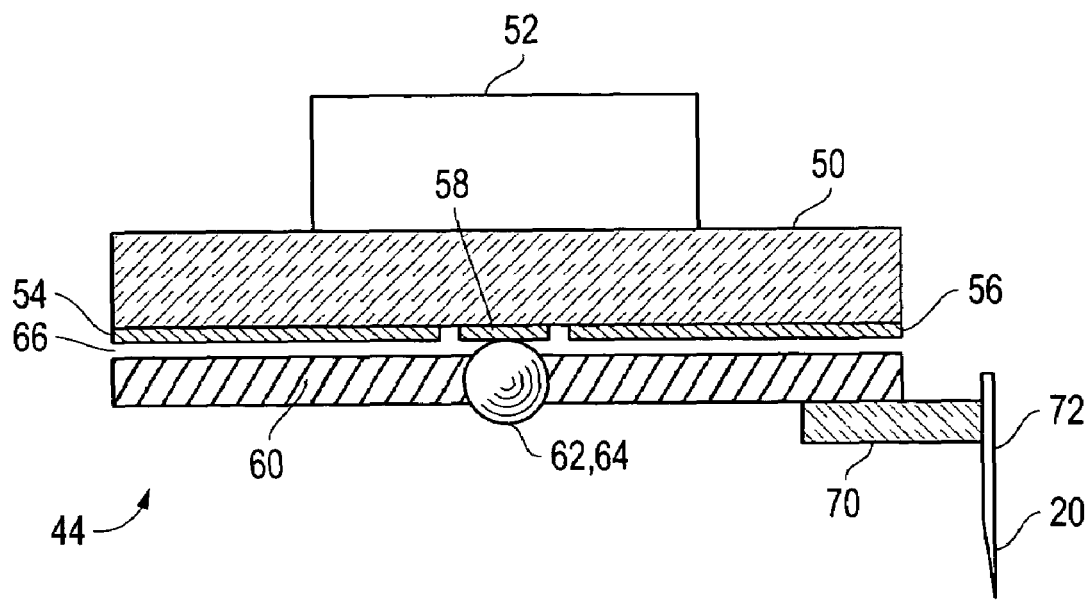
FIGS. 3 and 4 show principal parts of a probe head of an SNP.
Figure 4:
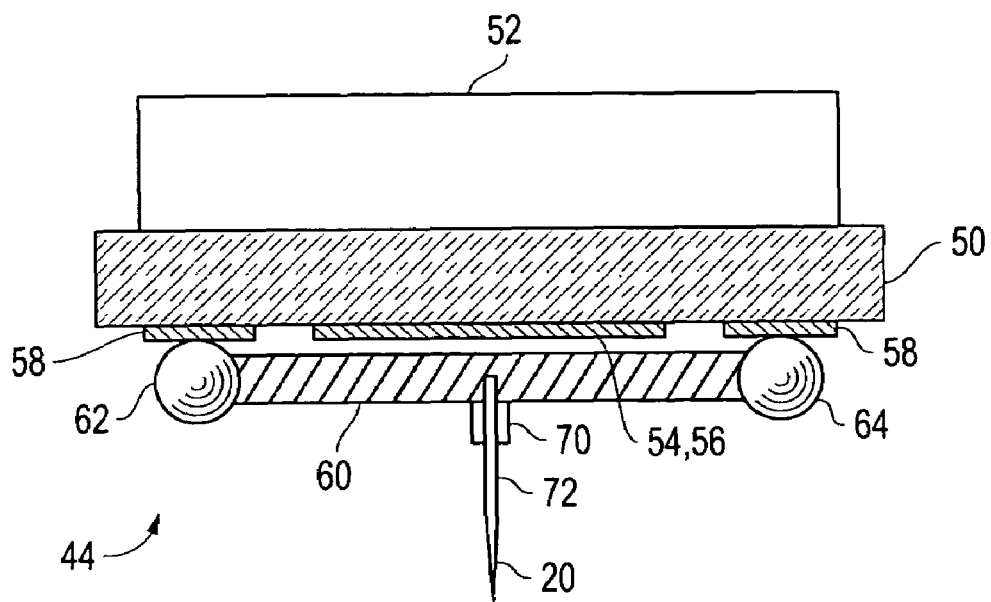

A preferred embodiment of the present invention provides a method and apparatus for repair of defects in photo masks and semiconductors. In a preferred embodiment, defects within a region of observation are identified. Then, for each defect a "manifold," that is, a boundary constraint on the region of space through which the probe tip will move to remove material, is defined for repair of the defect. A probe is selected for the repair, which desirably can be the same probe used for observation. The defect is repaired under control of an algorithm and, optionally, the repair region is reexamined and iteration of the repair procedure occurs. These steps are fully automate-able, or the user may be requested to initiate each step sequentially. And the user can select between one programmable sequence of steps and another.

Thus, in a preliminary step a mask or semiconductor to be repaired is loaded into the instrument of the present invention. The mask/semiconductor (hereafter "object") is positioned on a stage of a profilometer device or Stylus Nano Profilometer so that the x and y axes of the stage are in a defined relationship with respect to ortho-normal axes of the object. To achieve this, a function of three known reference points on the object is defined to determine a point in object coordinates. Thus, the probe is brought to each reference point and optical pattern recognition is used to determine the precise x-y coordinates of the point. The object coordinates, u-v, of any point are then expressible in terms of the x-y coordinates of the reference points and the linear and or rotational motion through which the stage is moved to observe the point.

The object may have been previously inspected for defects using separate inspection equipment, or may be inspected by the Stylus Nano Profilometer (SNP) to be used for repair, or both. When defects are identified, a file of a known format, herein referred to as a defect information file, is provided containing information concerning the location of the defect and the type of defect found. The defect information file is read prior to repair. The file includes for each defect a code that identifies the type of defect and parameters for repair, and identifies whether the defect is to be performed without operator intervention.

For each defect to be repaired, the information defect file guides the probe to the general area of repair. This brings the probe generally within 2 microns of the defect. A region of defect imaging is defined and the defect region is imaged in order to obtain topographical data on the defect. The defect imaging-region may be specified by the user or may default, for example, to a rectangle of dimension equal to the pitch of the defect region. The SNP allows the contact force (the downward force exerted by the probe on the sample) to be specified and provides real time force feedback and control. The imaging occurs at low force, which can be less than about 0.2 micro-Newtons, specifiable by the user. The SNP images by descending to contact the surface at a point to determine its height, rising, moving to the next point, and descending again to measure another point. The imaging occurs at a resolution (sampling density) that is also specifiable by the user or pre-programmed. The resolution selected will depend upon the mask type and the desired accuracy versus speed. Note that the imaging can be done in two steps. Preferably, a first imaging may be implemented at a low resolution to approximately image the defect, followed by a second imaging at high resolution for higher accuracy imaging of the defect. For example, a low resolution imaging step of 100 nanometers (nm) over a 4×4 micron square region may be employed followed by a high resolution imaging step of 10 nm over a 1×1 micron square region.

Figure 5:
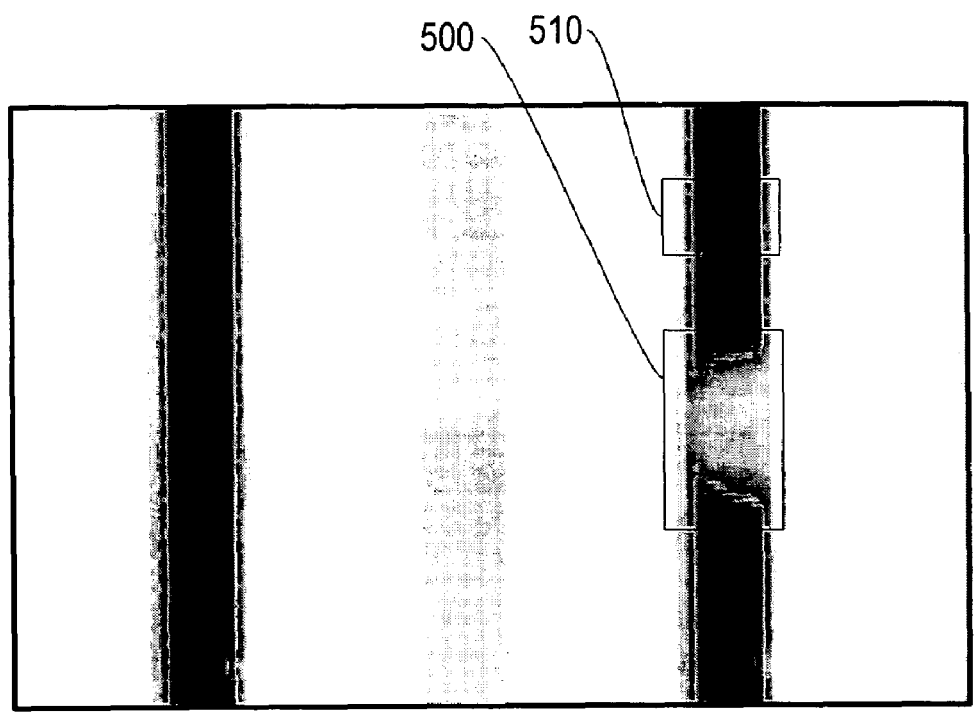
FIG. 5 is an image of a region with a defect.

After the defect region is imaged the exact defect is specified. Comparing the observed structure to the desired structure, referred to as a target structure specifies the defect. The target structure may ideally be the structure that should exist absent the defect. The structure that should exist absent the defect may be determined from a reference structure. For example, in the case of a line conductor, the reference structure may simply be the geometry of the line conductor that exists near to, but not including, the defect, as observed by the instrument. This is illustrated in FIG. 5, which shows part of a 4×4 micron-sampled area with equal steps in x and y. Pattern recognition algorithms may be employed to isolate the target area 500 containing the defect (or material to be removed). A defect-less area 510 is also imaged to obtain a three-dimensional repair boundary, herein called a manifold. The defect is then etched until it matches the manifold. Thus, before repairing the imaged defect, observation of a near by structure away from and not including the defect can provide the reference against which the defect is measured. Or the reference structure may be provided as an image file generated from a desired or expected geometry.

Figure 6:
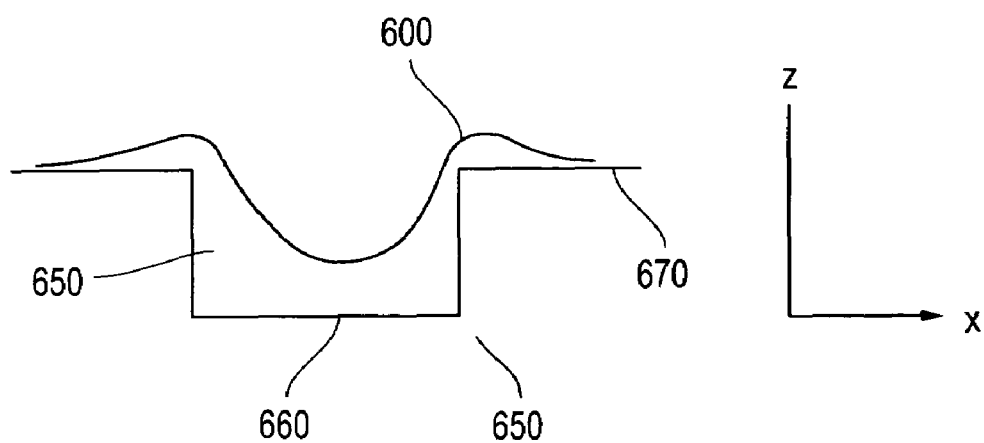
FIG. 6 is a cross section of a defect in and around a trench.

For example, refer to FIG. 6, which depicts cross section of a defect 600 in and around a line trough 650 with a bottom surface 660. A first portion of the defect lies above the upper surface 670 of the object. A second portion of the defect lies below surface 670 in trough 650 above and on bottom surface 660. A three-dimensional image of the defect and surrounding region is obtained by observing the defect imaging region at multiple sampling points.

The manifold limits the region through which the probe tip will pass, that is, the area that will be processed. To repair a defect in a complex structure, the manifold can be defined by a point-to-point correlation between a defectless reference area and the area to be repaired. For a simpler structure, such as line, it is only necessary to define the desired coordinate for the edge of the line to define the manifold. For a typical defect, such as extra material adjacent to a line, the manifold is defined by a reference area further up the line and an offset in the direction of the line. According to one mode of operation, once the defect is imaged, a rectangle is drawn in an x-y plane surrounding an outer perimeter of the defect. The defect circumscribed by the rectangle is then removed by causing the SNP probe to traverse the area within the rectangle to grind the defect into loose fragments to be swept away. In the example of FIG. 6, a lower limit on the vertical position of the probe tip may be defined by a plane coinciding with upper surface 670 as determined from the reference image. The system seeks to grind away the defect above upper surface 670 of the object. To this end, the probe of the SNP is brought into contact with the surface of the defect at high force (preferably corresponding to a pressure above the crushing threshold of the substrate material but well below that of the probe tip material), specifiable by the user. Unlike imaging in which the probe contacts the surface at a point and then lifts away from the surface to move to the next point, the probe is maintained in contact with the surface at the desired or specified force while moving in a definable trajectory, such as a raster pattern. The probe is then optionally dithered in an x-y plane while maintaining the probe forcibly against the object at the desired force. Dithering is a motion superimposed onto the raster, analogously to the way an orbital motion of an orbital is superimposed onto the motion of the sander movement by the operator. Dithering is thought to cause small fractures in the material which breaks up the defect into fragments that are pushed away. While dithering and under force and manifold constraints, the probe is moved within the rectangle. This continues until the probe tip reaches the plane defining the lower limit on the vertical position of the probe at all points within the defect area. Then the probe is moved away from the surface and moved to another defect to continue the defect repair process. After several defects are repaired, the substrate can be cleaned to remove debris and measured to determine whether the result of the repair is adequate. If not, the repair can be continued. SNP typically has a response frequency of about 1000 Hz. This fast response time allows faster dithering with higher removal rates.

Similarly, to remove defective material in trough 650, a lower vertical limit on the vertical position of the probe tip may be defined by a plane coinciding with lower surface 660 as determined from the reference image. The system now seeks to cut or grind away the defect above surface 660. The probe is brought into contact with the defect at controllable high force and dithered at a high rate to break up and push away the defect. As describe previously, the force balance system of the SNP allows the force to be continually measured by the balance beam sensor and controlled to maintain the desired force regardless of changes in the surface topography or tip wear. The force is measured using capacitors and the balance beam is brought into balance eletrostatically. The balance beam is servo-ed to maintain, on average, a balanced position during the grinding operation. The SNP can control the application of high force, such as 40 microNewtons of force, accurately to within about 0.1 to 0.5 microNewtons.

In some applications one may desire to not only etch away a defect but to also etch away some of the substrate. Thus, for example, using the present invention one may etch away at the wall of the trench to notch it, essentially making the trench wider. In these cases the manifold can be "biased" from an exact copy of a defect-free reference area. The bias may be specified in any direction. In some applications, bias may be desired because the defect removal process may leave different surface properties than normal substrate processing. For example, a photomask may have different optical properties at a repair site even though the geometry is exactly restored, because of differences in roughness or other material properties. Bias can compensate for these effects.

According to a second mode of operation, the image of the defective region is presented as contours. The SNP probe tip is directed to scrape away the defect within a contour, rather than to an entire rectangle circumscribing the defect. Thus, in this mode the probe tip is efficiently directed to the defect. The probe is dithered in an x-y plane within a contour while maintaining the probe forcibly against the object. While dithering and under force and manifold constraints, the probe is scanned to a new raster point within the contour. This continues until the probe tip reaches the plane defining the lower limit on the vertical position of the probe at all points within the contour. Then the probe is moved away from the surface and scanned to a new defect to continue the defect repair process.

Until the probe tip reaches the manifold, dithering continues. The dithering occurs at a high rate, on the order of kilo-Hertz, in a line or in a prescribed continuous curve such as a circle or ellipse. If the manifold is reached, the force (and therefore pressure) is reduced, the grinding slows to a negligible rate, and the probe is rastered to another point in the defect imaging area, or to a new defect region. Calibration is performed periodically as pre-programmed or at the selection of the user to ensure accuracy of position and to evaluate tip wear. The rate of scan between points in the repair area is on the order of Hertz. Thus, the system is scanned at a much slower rate than the dither rate.

Mill rates are directly related to dither rates. Dithering allows a much higher probe velocity without unwanted tip damage from, for example, hitting a steep feature. The dithering frequency is optimized for the response of the scanner/tip system. Higher frequencies generally increase the rate of material removal, but the mechanical response of the scanner limits the upper dithering frequency. The dithering frequency is preferably greater than 300 Hz, more preferably greater than 500 Hz, even more preferably greater than 800 Hz, and most preferably about 1,000 Hz or greater. Note that the actual dithering amplitude may be less than the specified amplitude of scanner displacement because of the response of the scanner. Position sensors are used to determine the actual amplitude response of the scanner. Note also, that probe flex can be taken into account when specifying the amplitude of dither, since probe flex will reduce the amplitude of probe tip motion. For example, if the probe flexes by 5 nano-meters (nm), the tip motion is reduced by 10 nm from the true dither amplitude of the scanner. Rastering and dithering has to move the tip across the surface to be effective, so the probe must flex less than the requested motions. Frictional force is the cause of flex, roughly 25% of the vertical applied force. For example, a 250×250×800 nanometer diamond tip flexes 9 nm for horizontal force of 15 uN. Probe flex also includes flex in the support structure between the balance beam assembly and the probe tip.

As previously noted, the dithering pattern may be specified. The dithering is controlled by applying a signal having an x component, a y-component, or both, superimposed onto the signal that moves the probe tip. The shape of the dithering pattern will depend upon the relative amplitudes of the x and y components and their relative phases. The preferred shape of the dither will depend upon the application. Edge placement is not well defined in the dither direction, so it is better to dither in a direction in which the edge placement is not important. For example, a defect bump within a long trench is best removed by dithering mostly along the direction of the trench, not across it. An isolated bump on a flat area of the object might be removed by dithering in a circular, elliptical, or even random pattern.

The mill rate is directly related to the pressure between the probe tip and the substrate. The present invention provides for the probe tip to be applied against the surface at a controllable determinable pressure. Pressure is the ratio of applied force to surface area of contact. The applied force is controllable by way of the balanced beam force feedback system of the Stylus Nano Profilometer described above. The surface area of the probe is determined by performing a series of profiles of special substrates called characterizers. Each characterizer profile contributes a particular segment to the probe shape. Thus, controlling the applied force and knowing the probe shape, a substantially constant pressure can be applied. Because the SNP can readily jump to different locations, the tip can be characterized often as it wears to provide accurate pressure information. Also, by knowing the probe shape, the SNP images a region by collecting the measured data and mathematically subtracting the probe shape from the measured data. Thus, probe characterization is used to determine pressure and to image the object.

Figure 7:
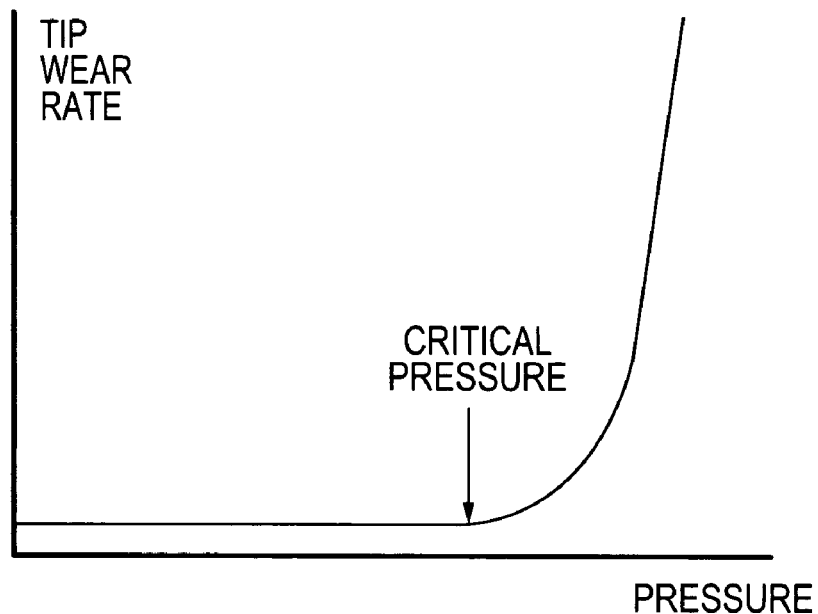
FIG. 7 is curve showing wear rate as a function of pressure.

As shown in FIG. 7, wear rate as a function of pressure increases sharply beyond some critical pressure, typically about ⅓ of the compressive strength. Thus, to provide rapid etching with reduced tip wear, it is desirable to operate at a pressure that is above the critical pressure of the material being etched, but below the critical pressure of the tip material. Thus, there is a narrow window of permissible pressure that will remove substrate material rapidly without imposing excessive wear on the tip. The SNP of the present invention is well-suited to this purpose because of its ability to accurate apply a specified pressure. The SNP can accurately apply a specified force and can rapidly determine tip shape to determine the applied pressure. Because the pressure is controllable, operation below the critical pressure of the tip material can be ensured. For example, the compressive strength of diamond is 5 to 10 giga-Pascals (gPa). For quartz the compressive strength is about 1 gPa and for chrome it is about 2 gPa. Thus, using a diamond probe tip to cut into a material such as quartz or chrome, the applied pressure can be ensured to be above the compressive strength limit of the material but below the critical pressure for the diamond. For example, a preferred pressure for etching quartz using a diamond is about 1 gPa. There are cases where a lot of material has to be removed. Here the operator may choose a higher pressure (perhaps as much as 6 gPa) and sacrifice some tip lifetime to achieve a rapid repair.

In addition to etching away a defect using the dithering described above, the present invention provides for milling into a defect by rapidly bringing the tip of the probe in high force contact with it. This can be done repeatedly in short succession at a resonant frequency of the balance beam of the SNP to create a jackhammer effect. This jackhammer approach fractures hard defects so that subsequent etching is more efficiently applied.

To achieve a repair of greater quality, according to the present invention, pressure is reduced toward the end of the repair process to achieve greater precision. Indeed as the force is maintained at a given level, pressure may naturally decrease as the area of surface contact increases. For example, referring again to FIG. 6, as the defect in trough 650 is worn away the trench deepens. Along the sidewalls, the surface area of contact between the tip and the sidewall is great, resulting in lower pressure. This in turn results in a lower mill rate. By increasing the applied force in this circumstance, higher pressure can be restored. Once again, pressure is calculated knowing the probe shape as determined from characterizers as described above.

Clearly, the accuracy of the repair requires the ability to accurately position the probe and to characterize the probe shape. To achieve nano-meter positioning accuracy, the scanner is desirably designed to tight tolerances. The present invention provides for intermittent referencing by scanning the probe to characterizers, as described above, to characterize probe shape. This way, tip wear can be at least partially compensated for using known mathematical calculations, and tip contact-surface area can be monitored so that pressure can be controlled. Also, by intermittently scanning the probe to multiple known reference points, the system can compensate for stage drift within 2 to 10 nano-meters (nm).

For example, periodic measurements of a z-position of a substrate surface that is locally flat about the reference point can be used to compensate for stage drift. This can be done in two steps. First, the probe is rapidly moved in less than 10 milliseconds (ms) to the x-y coordinate of the reference point at a height above the surface, say about 20 to 200 nano-meters (nm). Second, the tip is brought into contact with the surface and the height is measured. This can also be done in less than 10 ms. Such measurements made at several spaced-apart points can be averaged for improved accuracy. Because the balance beam mechanism of the SNP is designed to measure by descending rapidly and contacting the surface, rather than descending slowly and scanning along the surface, the SNP can measure points that are spaced apart much more rapidly that a cantilever-type scanning probe device. This permits more frequent recalibrations to compensate for system drift such as stage drift.

As another example, periodic measurement of sample points tracking wall position of a straight trench can be used to compensate for stage drift. In the case of a sidewall reference structure, better determination of the position of the wall—within 1 to 5 nm—can be gained by approaching the wall at a diagonal trajectory. Thus, the invention provides for rapid intermittent or periodic scanning to one or more reference points to monitor tip wear and compensate for stage drift. A reference point can be scanned to and measured in as little as 20 ms using the SNP even if it is several microns away from the mill area.

Indeed the system can be easily switched between scanning and milling without any change in hardware. Scanning, dithering, and jackhammer-ing of the probe at controlled force are under the control of software with a user interface to allow user operation and control of the above-described processes. Thus, a higher force milling process may be interspersed with low or high force scans or other measurements. Software control of the applied force is available because the force is controlled by the SNP is determined by the electrostatic force applied to the balance beam, which can be readily changed by altering the voltage. Some prior art systems require changes to the position of the cantilever to alter the force.

Figure 8:
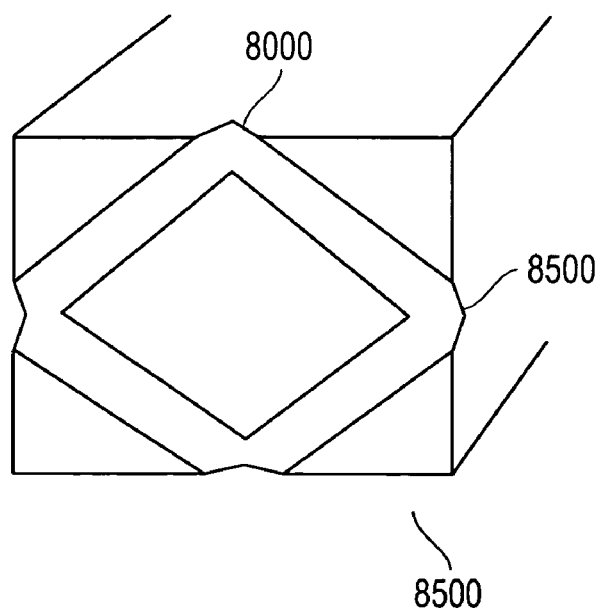
FIG. 8 is a probe tip with channels for removal of debris.

To facilitate removal of defect matter scraped loose by the inventive process described herein, a probe tip that exhibits channels or grooves such as the one shown in FIG. 8 may be employed. In FIG. 8, channels 8000 are provided on probe tip 8500, the portion of the probe located at the utmost end and the portion that makes contact with the sample. Channels 8000 allow defect matter and debris to be plowed away through the channels as the tip is dithered. The tip is preferably made of diamond and the grooves are scored into the end of the tip using a focused ion beam (FIB) Worn tips can be reconditioned by polishing them on an abrasive diamond surface of the desired orientation. As mentioned above, the probe is periodically scanned to a reference structure for calibration. The calibration is performed by scanning a known reference structure that reveals and enables some correction for defects in the tip. Note that different milling probes can be used for different types of repairs or even different aspects of a single repair. Thus, one can choose the best tip shape for a particular application. For example, for "pin-dots," a broad stiff tip is desired, to quickly remove asperities. For APSM bridges, a high-aspect tip is desired, in order to characterize feature walls, and chisel the defect to match. A probe tip can be made into practically any useful shape desired by milling the probe tip with a Focused Ion Beam (FIB). Also, one probe may be used for milling, and another for imaging. Probes of the SNP can be exchanged within 1 to 5 minutes.

Thus, the present invention provides a method for identifying and repairing defects in semi-conductors and masks. Once defects have been corrected according to the method just described, the debris and defect matter etched loose by the process may be removed in chemical post processing methods known in the art. The method is best suited for repairing defects in fine structures, but repairs to coarser or bigger structures are contemplated as well. For large defects, a Focused Ion Beam (FIB) can be used to mill most of the defect, and the present invention can then be employed for fine defect repair. The present invention has the advantage that it can be used to repair defects in very fine structures without implantation of impurities. The invention is not limited to the repair of defects in lithography masks, but can be used to modify any nano-or micron scale structure.

The SNP of the preferred embodiment uses a balance beam. The construction allows the probe to descend at a rapid constant velocity toward the surface from an unknown height and to stop the descent when the balance beam is knocked out of balance as the surface is contacted. The balance also tilts backward upon contact cushioning the blow on the fragile tip. An AFM, on the other hand, is designed to detect small forces, such as van der Waals forces, within a small range of forces, by changes in the vibration frequency of the cantilever and therefore must descend much more slowly to detect when it approaches the surface to avoid damaging the tip. Moreover, AFMs are designed to scan in a line near the surface and continually take reading without disengaging from the surface and so are not required to raise and lower at every measurement. The SNP on the other hand, is designed to approach and contact the surface to measure a single point, rise from the surface, change positions, and then approach the surface again at a different point. When measuring, the SNP "hops" between measurement points, that is, raises between measurement points and contacts at each point. When milling to remove material, the SNP remains in contact with the surface, applying a specified force that is typically controlled and measured electrostatically. Additional advantages and methods of operating a SNP are described in assignee's co-pending application U.S. patent application Ser. No. 11/036768, entitled "Method Of Operating A Probe Microscope," filed Jan. 14, 2005, which is hereby incorporated by reference.

Embodiments of the invention can provide a removal rate of chrome, greater than about 0.08 cubic microns per minute and equal to or greater than about a tenth (0.1) of a cubic micron per minute. This removal rate is comparable to removal rates of focused ion beam repairs. The force applied can be greater than 40 microNewtons, greater than 50 microNewtons, greater than 75 microNewtons, or greater than about 100 microNewtons. The maximum applied force that can be applied is limited by the physical limits of the system, particularly the lateral stability of the beam on the base plate.

Repair of modern lithography masks typically requires an accuracy of about 10 nm when altering the mask surface. The force feedback available on the SNP allows it to remove material from the mask at accuracies of 2-10 nm. The SNP has world-class Z height precision—the spec is a quarter of a nanometer, 3 sigma, 8 line average. In principle, the etch can be controlled to roughly this level. In practice, a working precision of 1-2 nm is expected, compared to today's accepted precision of 10 nm.

The invention is suitable for repair of phase shift masks, which can be difficult to repair on a focused ion beam system because the defect, a quartz bump, is made of the same material as the substrate, and it is difficult to determine when to stop the beam. In the present invention, a manifold is defined by reference to a non-defective area, and the quartz defect is removed until the repaired area matches the reference area. By controlling the applied force and keeping the tip within the manifold, the defect is removed with little or no damage to the substrate.

The process can be automated, with a defect file being provided from a mask inspection system. The mask can be automatically aligned and scaled using reference points on the mask. Each defect can be automatically located, a manifold defined by comparison to a design data or to a corresponding non-defective area, and the repair can proceed automatically.

Although the present invention and its advantages have been described in detail, it should be understood that various changes, substitutions and alterations can be made herein without departing from the spirit and scope of the invention as defined by the appended claims. Because the invention can be used in different applications for different purposes, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method for modifying the structure of a sample, comprising the steps of:
    providing a profilometer with a probe on a balance beam;
    obtaining topographical data on a target area;
    comparing the observed structure of the target area to the desired structure of the target area;
    bringing the probe in contact with the sample surface within the target area;
    controlling to contact force exerted by the probe on the sample so that a specified force sufficient to remove material from the sample surface is exerted; and
    processing the sample by moving the probe across the sample surface in a definable trajectory at the specified contact force which is continually sensed and controlled in order to remove sufficient material from the sample surface so that the observed structure of the target area will more closely match the desired structure of the target area.

2. The method of claim 1 wherein obtaining topographical data on a target area comprises imaging a target area using a profilometer device probe.

3. The method of claim 1 wherein obtaining topographical data on a target area further comprises:
    identifying target material to be removed from a sample surface;
    determining a horizontal repair boundary around the target material; and
    imaging the area within the repair boundary using a profilometer device probe.

4. The method of claim 3 wherein imaging the area within the repair boundary using the Stylus Nano-Profilometer probe comprises:
    imaging a larger area within the repair boundary at a tower resolution; and
    imaging a smaller area of interest at a higher resolution.

5. The method of claim 3 further comprising:
    determining a lower vertical boundary for processing for each point within the repair boundary; and
    combining the horizontal repair boundary and the lower vertical limit to define a three-dimensional manifold through which the probe tip will pass during processing.

6. The method of claim 3 further comprising, after the step of comparing the observed structure of the target area to the desired structure of the target area, imaging a defectless reference area of the sample in order to define a lower vertical limit for material removal as a plane coinciding with the upper surface of the reference area.

7. The method of claim 5 wherein moving the probe across the sample surface comprises moving the probe against the sample surface within the repair boundary until the probe tip reaches the defined lower vertical limit.

8. The method of claim 1 wherein said contact force is a pressure above the crushing threshold of the sample material but below the crushing threshold of the probe material.

9. The method of claim 1 wherein said contact force is continually measured and controlled to maintain the specified force regardless of changes in the topography of the sample surface or erosion of the probe.

10. The method of claim 9 in which moving the probe across the sample surface in a definable trajectory comprises dithering the probe in the x-y plane while simultaneously moving the probe across the sample surface.

11. The method of claim 9 in which moving the probe across the sample surface in a definable trajectory comprises applying a signal having an x-component, a y-component, or both, superimposed onto The signal that moves the probe across the sample surface.

12. The method of claim 10 in which dithering the probe in the x-y plane comprises moving the probe across the sample surface along a line parallel to a first horizontal direction while simultaneously moving the probe back and forth along a line perpendicular to said first direction.

13. The method of claim 10 in which dithering The probe in the x-y plane comprises moving the probe in a circular, elliptical, or random pattern while simultaneously moving the probe across the sample surface.

14. The method of claim 10 in which the dithering has a frequency of greater than 300 Hz.

15. The method of claim 10 in which the dithering has a frequency of greater than 1000 Hz.

16. The method of claim 12 in which the probe's rate of movement along the line parallel to a first horizontal direction is substantially slower than the probe's rate of movement back and forth along the line perpendicular to said first direction.

17. The method of claim 1 wherein controlling the contact force comprises:
determining the desired ratio of the downward force applied by the probe on the sample to the surface area of contact between the probe and the sample;
controlling the applied force by way of the balanced beam force feedback system of the profilometer device;
determining the surface area of contact between the probe and the sample by scanning a known reference structure with the probe in order to characterize the actual probe shape; and
adjusting the applied force so that the desired ratio of applied force to surface area is maintained.

18. The method of claim 17 further comprising periodically interrupting the movement of the probe across the sample surface in order to scan the known reference structure with the probe in order to characterize the current probe shape and account for probe erosion or damage.

19. The method of claim 1 further comprising:
after sufficient material has been removed from the sample surface, cleaning the sample surface to remove debris;
re-comparing the observed structure of the target area to the desired structure of the target area in order to determine if the material removal is adequate; and
if not, continuing the material removal by moving the probe across the sample surface in a definable trajectory at the specified contact force in order to remove sufficient material from the sample surface so that the observed structure of the target area will more closely match the desired structure of the target area.

20. The method claim 1 further comprising;
moving the probe so that it is above a portion of the sample to be removed;
rapidly bringing lowering the probe until it makes contacts with the sample at a high contact force;
raising the probe back up above the sample; and
repeating the raising and lowering of the probe in short succession at a resonant frequency of the balance beam of the profilometer device creating a jackhammer effect.

21. A method for modifying the structure of a sample, comprising the steps of:
providing a profilometer with a probe on a balance beam;
said probe having a tip for contacting a sample;
one or more channels formed in the contact surface of said tip;
said one or more channels being suitable to allow material removed from the sample surface to be channeled away as the tip is moved across the sample surface;
obtaining topographical data on a target area;
comparing the observed structure of the target area to the desired structure of the target area;
bringing the probe in contact with the sample surface within the target area;
controlling the contact force exerted by the probe on the sample so that a specified force sufficient to remove material from the sample surface is exerted; and processing the sample by moving the probe across the sample surface in a definable trajectory at the specified contact force which is continually sensed and controlled in order to remove sufficient material from the sample surface so that the observed structure of the target area will more closely match the desired structure of the target area.

22. A method for repairing a defect on a semi-conductor wafer and mask, comprising the steps of:
providing a profilometer device with a probe on a balance beam;
identifying defect material on the sample;
bringing the probe in contact with the defect material at a controlled downward contact force sufficient to remove defect material from the sample; and
dithering the probe in the x-y plane while the probe is scanned across the defect surface while maintaining the downward contact force in order to remove defect material from the sample surface.

23. A method for modifying the structure of a sample, comprising the steps of:
providing a Scanning Probe Microscope with a probe;
obtaining topographical data on a target-area;
comparing the observed structure of the target area to the desired structure of the target area;
bringing the probe in contact with the sample surface within the target area;
exerting a downward contact force by the probe on the sample so that a force sufficient to remove material from the sample surface is exerted; and
dithering the probe in the x-y plane within the target area in a definable trajectory while maintaining the downward contact force in order to remove sufficient material from the sample surface so that the observed structure of the target area will more closely match The desired structure of the target area.

24. The method of claim 23 in which dithering the probe in the x-y plane comprises applying a signal having an x-component, a y-component, or both, superimposed onto the signal that moves the probe tip across the sample surface.

25. The method of claim 23 in which dithering the probe in the x-y plane comprises moving the probe across the sample surface along a line parallel to a first horizontal direction while simultaneously moving the probe back and forth along a line perpendicular to said first direction.

26. The method of claim 23 in which dithering the probe in the x-y plane comprises moving the probe in a circular, elliptical, or random pattern while simultaneously moving the probe across the sample surface.

27. The method of claim 23 further comprising;
moving the probe so that it is above a portion of the sample to be removed;
rapidly bringing lowering the probe until it makes contact with the sample at a high contact force;
raising the probe back up above the sample; and
repeating the raising and lowering of the probe in short succession creating a jackhammer effect.

* * * * *